(12) United States Patent
Ho et al.

(10) Patent No.: US 9,112,459 B2
(45) Date of Patent: Aug. 18, 2015

(54) TRANSFORMER POWER AMPLIFIER

(71) Applicant: NATIONAL TAIWAN UNIVERSITY, Taipei (TW)

(72) Inventors: Chieh-Jui Ho, Taipei (TW); Hen-Wai Tsao, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 214 days.

(21) Appl. No.: 13/763,314

(22) Filed: Feb. 8, 2013

(65) Prior Publication Data

US 2013/0207719 A1   Aug. 15, 2013

(30) Foreign Application Priority Data

Feb. 10, 2012 (TW) .............................. 101104411 A

(51) Int. Cl.
*H03F 3/14* (2006.01)
*H03F 3/45* (2006.01)
*H03F 3/60* (2006.01)

(52) U.S. Cl.
CPC .............. *H03F 3/45* (2013.01); *H03F 3/45179* (2013.01); *H03F 3/602* (2013.01); *H03F 2200/537* (2013.01); *H03F 2203/45731* (2013.01)

(58) Field of Classification Search
USPC ......................................... 330/307, 190, 276
IPC ......................................................... H03F 3/14
See application file for complete search history.

(56) References Cited

U.S. PATENT DOCUMENTS

| | | | |
|---|---|---|---|
| 6,259,249 B1 * | 7/2001 | Miyata ..................... | 324/207.17 |
| 6,424,227 B1 * | 7/2002 | El-Sharawy .................. | 330/307 |
| 6,816,012 B2 * | 11/2004 | Aoki et al. ..................... | 330/276 |
| 6,856,199 B2 * | 2/2005 | Komijani et al. ............. | 330/276 |
| 7,372,336 B2 * | 5/2008 | Lee et al. ....................... | 330/307 |
| 7,876,162 B2 * | 1/2011 | Onizuka et al. ............... | 330/307 |
| 7,990,220 B2 * | 8/2011 | Kondo et al. .................. | 330/276 |
| 2010/0244955 A1 * | 9/2010 | Komijani et al. ............. | 330/151 |

* cited by examiner

*Primary Examiner* — Patricia T Nguyen
(74) *Attorney, Agent, or Firm* — Huffman Law Group, PC

(57) ABSTRACT

The present disclosure relates, according to some embodiments, to a transformer power amplifier that allows for improved Q values and increased efficiency by reducing the capacitance coupling effect between metal layers and/or sidewalls of the same layer through carefully designed conductor structures in primary and secondary loops. A transformer power amplifier comprises a substrate, a conductor, a circular coil, a first amplifier, and a second amplifier, the conductor and the circular coil disposed on the substrate. A circular coil has a first input terminal and a second input terminal, in which the first input terminal and the second input terminal are spaced apart and opposite each other to form an opening. A first amplifier is connected to a first input terminal for receiving a first signal and a second amplifier is connected to a second input terminal for receiving a second signal, wherein the first signal and the second signal are differential signals.

20 Claims, 9 Drawing Sheets

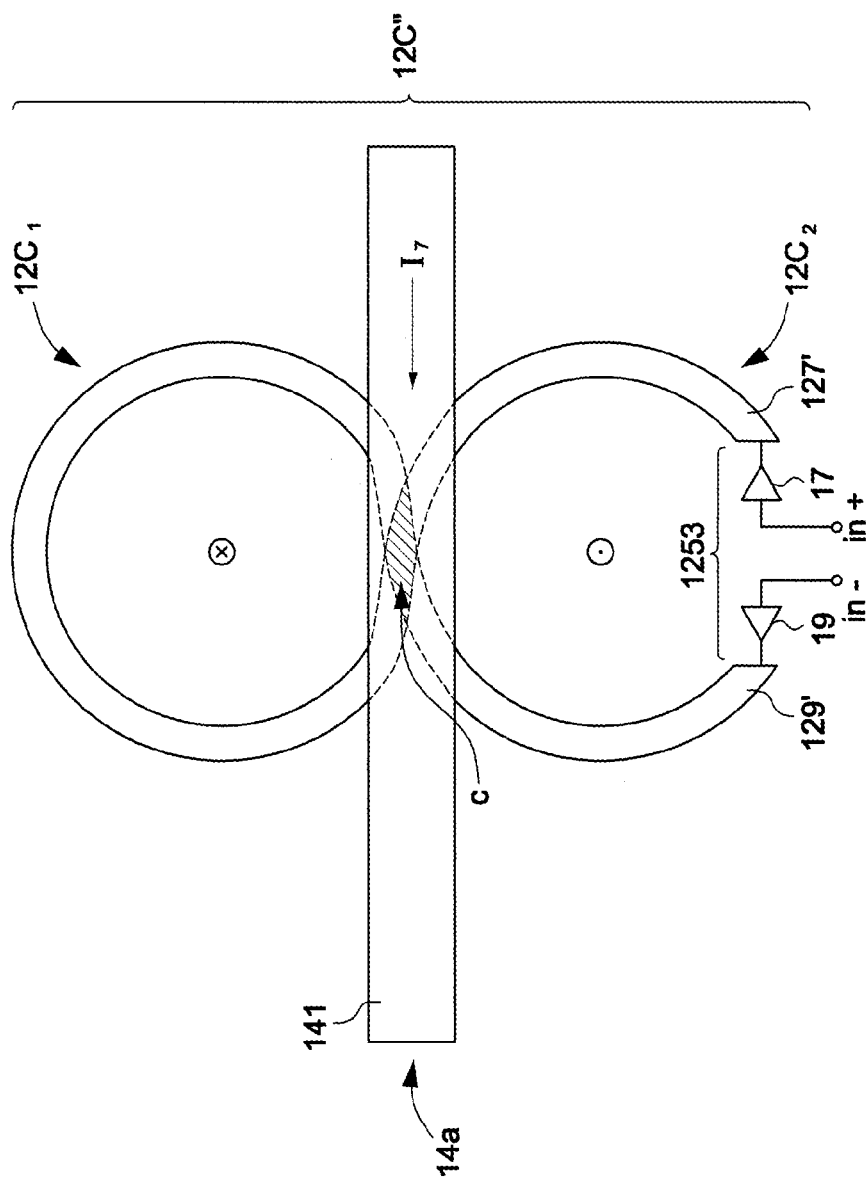

TRANSFORMER POWER AMPLIFIER

CROSS-REFERENCE TO RELATED APPLICATION(S)

This application claims priority to Taiwan Patent Application No. 101104411, filed on Feb. 10, 2012, the disclosure of which is hereby incorporated by reference in its entirety.

BACKGROUND OF THE DISCLOSURE

1. Field of the Disclosure

The present disclosure generally relates to a design of an integrated circuit, and more particularly to an active transformer power amplifier structure.

2. Description of the Related Art

As communication technologies such as mobile phones, the internet, and digital televisions become more popular, there is an increased need for a high quality and low cost power amplifier. However, problems with the current complementary metal-oxide-semiconductor ("CMOS") process may include low breakdown voltages and high substrate loss of silicon. Therefore, an approach to power synthetic through a transformer is proposed in order to reduce the area of transistors as well as increase the output power. However, a conventional transformer structure requires a large secondary winding when integrating multiple transistors or doing high ratio impedance transforms, which will cause the Q factor value to decrease. This problem becomes more severe when integrating additional transistors.

One way to address this issue is by implementing a discrete-type active transformer structure, which has the advantages of excellent characters and good impedance matching. However, it still encounters consuming large layout area problem when using a large number of transistors. In addition, the lack of design flexibility of the discrete-type active transformer structure makes it difficult to implement in the system in on-chip applications.

SUMMARY OF THE DISCLOSURE

Therefore, the present disclosure provides a transformer power amplifier that can improve the Q value and increase its efficiency by reducing the capacitance coupling effect between the metal layers and/or the sidewalls of the same layer through careful design of the conductor structures in its primary and secondary loops.

In one embodiment, a transformer power amplifier is provided. The transformer power amplifier comprises a substrate, a conductor, a circular coil, a first amplifier, and a second amplifier. The conductor and circular coil are both disposed on the substrate. The conductor has a first elongated portion, the circular coil is located near one side of the first elongated portion, and the circular coil has a first input terminal and a second input terminal, wherein the first input terminal and the second input terminal are spaced apart and opposite each other to form an opening. The first amplifier is connected to the first input terminal for receiving a first signal. The second amplifier is connected to the second input terminal for receiving a second signal, wherein the first signal and the second signal are differential signals to form an alternative current on the circuit coil and electromagnetically coupled with the conductor through an induced current or an induced voltage on the conductor.

In one embodiment, another transformer power amplifier is provided. The transformer power amplifier comprises a substrate, a conductor, a first conductor wiring body, a second conductor wiring body, a first amplifier, a second amplifier, a third amplifier, and a fourth amplifier. The conductor, the first conductor wiring body, and the second conductor wiring body are all disposed on the substrate. The first conductor wiring body and the second conductor wiring body are located near one side of the first elongated portion. The conductor has a first elongated portion. The first conductor wiring body has a first input terminal and the second input terminal, the second conductor wiring body has a third input terminal and a fourth input terminal, wherein the first input terminal and the third input terminal are spaced apart and opposite with each other, the second input terminal and the fourth input terminal are spaced apart and opposite with each other, the first conductor wiring body and the second conductor wiring body form a circular coil with two openings. The first amplifier and the second amplifier are electrically connected to the first input terminal and the second input terminal respectively, and the first amplifier receives a first signal and the second amplifier receives a second signal, wherein the first signal and the second signal are differential signals. The third amplifier and the fourth amplifier are electrically connected to the third input terminal and the fourth input terminal respectively, and the third amplifier receives the first signal and the fourth amplifier receives the second signal to form an alternating current on the circular coil and electromagnetically coupled to the conductor to induce an induced current or an induced voltage on the conductor.

In one embodiment, another transformer power amplifier is provided. The transformer power amplifier comprises a substrate, a conductor, at least one first circular coil, at least one second circular coil, a first amplifier, and a second amplifier. The conductor, the at least one first circular coil, and the at least one second circular coil are all disposed on the substrate. The conductor has a first elongated portion. Each of the at least one first circular coil is located near one side of the first elongated portion, and has a first input terminal and a second input terminal, wherein the first input terminal and the second input terminal are spaced apart and opposite with each other to form an opening. Each of the at least one second circular coil is located near the other side of the first elongated portion, and has a third input terminal and a fourth input terminal, wherein the third input terminal and the fourth input terminal are spaced apart and opposite with each other to form an opening. The first amplifier is electrically connected between the first input terminal and the third input terminal, and the second amplifier is connected between the second input terminal and the fourth input terminal respectively, to form a first alternative current on each first circuit coil and a second alternative current on each second circuit coil, wherein the first alternative current and the second alternative current are in opposite direction, and respectively electromagnetically coupled to the conductor to induce an induced current or an induced voltage on the conductor.

In one embodiment, another transformer power amplifier is provided. The transformer power amplifier comprises a substrate, a conductor, at least one first circular coil, at least one second circular coil, a first amplifier, a second amplifier, a third amplifier and a fourth amplifier. The conductor, the at least one first circular coil, and the at least one second circular coil are all disposed on the substrate. The conductor has a first elongated portion. Each of the at least one first circular coil has a first input terminal and a second input terminal, wherein the first input terminal and the second input terminal are spaced apart and opposite with each other to form an opening. Each of the at least one second circular coil has a third input terminal and a fourth input terminal, wherein the third input terminal and the fourth input terminal are spaced apart and opposite with each other to form an opening. The first amplifier is connected to the first input terminal, and the second amplifier is connected is to the second input terminal to form a first alternative current on each first circuit coil. The third amplifier is connected to the third input terminal, and the fourth amplifier is connected to the fourth input terminal to form a second alternative current on each second circuit coil, wherein the first alternative current and the second alternative current are in opposite directions, and respectively electromagnetically coupled to the conductor to induce an induced current or an induced voltage on the conductor.

In one embodiment, another transformer power amplifier is provided. The transformer power amplifier comprises a substrate, a conductor, an 8-shape conductor wiring body, a first amplifier, and a second amplifier. The conductor and the 8-shape conductor wiring body are both disposed on the substrate. The 8-shape conductor wiring body comprises a first circular coil, a second circular coil, a cross portion, a first input terminal, and a second input terminal. The cross portion is connected between the first circular coil and the second circular coil and located across the first elongated portion. The first circular coil and the second circular coil are located near two opposite sides of the first elongated portion. The first input terminal and the second input terminal are spaced apart and opposite each other to form an opening. The first amplifier is electrically connected to the first input terminal for receiving a first signal. The second amplifier is electrically connected to the second input terminal for receiving a second signal, wherein the first signal and the second signal are differential signals to form an alternative current on the 8-shape conductor wiring body and electromagnetically coupled to the conductor to induce an induced current and an induced voltage on the conductor.

Therefore, the present disclosure advantageously improves the Q value and increases the efficiency of a transformer power amplifier design that can be implemented in a highly integrated system on-chip application.

The foregoing is a summary and shall not be construed to limit the scope of the claims. The operations and devices disclosed herein may be implemented in a number of ways, and such changes and modifications may be made without departing from this invention and its broader aspects. Other aspects, inventive features, and advantages of the invention, as defined solely by the claims, are described in the non-limiting detailed description set forth below.

BRIEF DESCRIPTION OF THE DRAWINGS

FIG. 2C depicts a transformer power amplifier according to an embodiment of the present disclosure.

DETAILED DESCRIPTION OF EMBODIMENTS

Figure 1A:
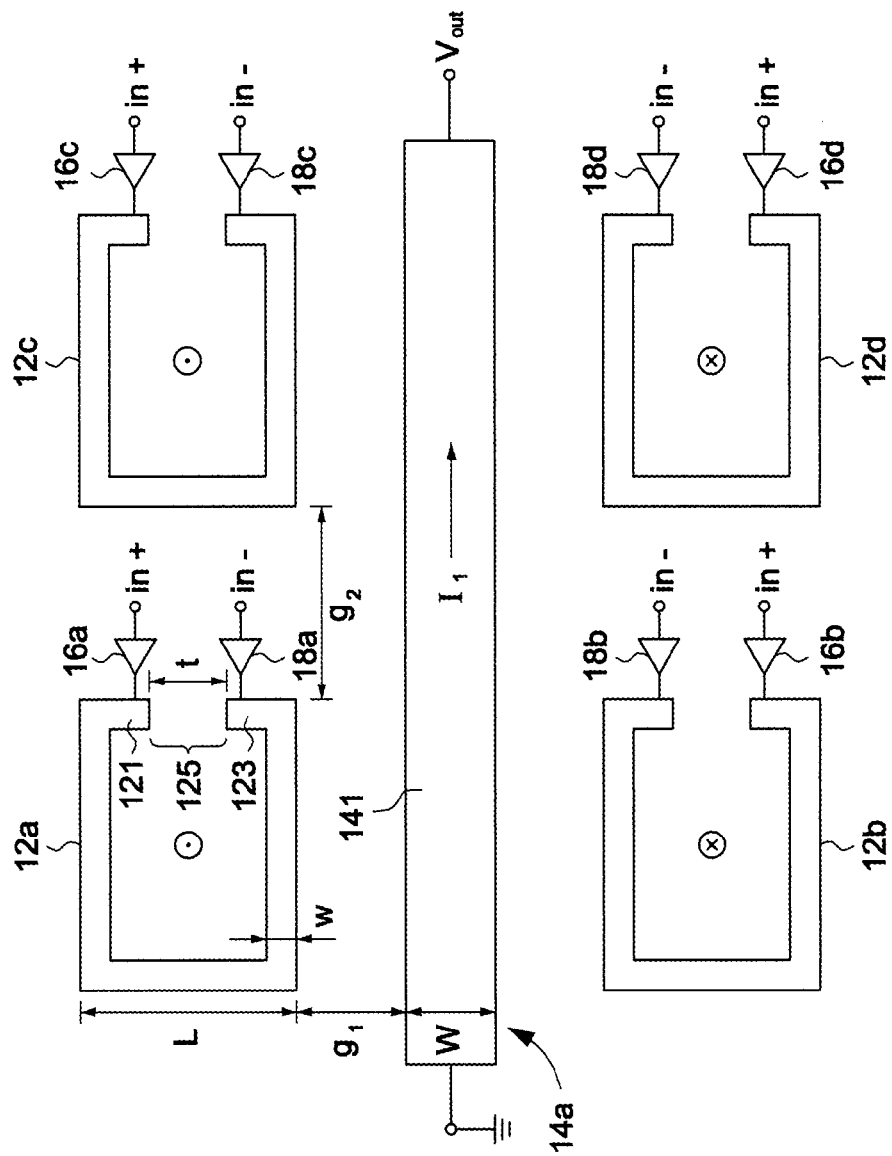
FIG. 1A depicts a transformer power amplifier according to an embodiment of the present disclosure.

Reference will be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present disclosure. It is to be understood that elements not specifically shown or described may take various forms well known to those skilled in the art. Further, when a layer is referred to as being on another layer or "on" a substrate, it may be directly on the other layer or on the substrate, or intervening layers may also be present.

FIG. 1A depicts a transformer power amplifier 1A according to an embodiment of the present disclosure. As shown in FIG. 1A, a transformer power amplifier 1A comprises a substrate (not shown), a conductor 14a, at least one circular coil, and multiple amplifiers 16a, 16b, 16c, 16d, 18a, 18b, 18c, and 18d. In an embodiment, the at least one circular coil includes a first circular coil 12a, a second circular coil 12b, a third circular coil 12c, and a fourth circular coil 12d. The conductor 14a, and at least one circular coil 12a, 12b, 12c, 12d are formed in the same layer or different layers on the substrate by using the semiconductor process, that is, the conductor 14a, and at least one circular coil 12a, 12b, 12c, 12d may have different height levels on the substrate. The multiple amplifiers 16a, 16b, 16c, 16d, 18a, 18b, 18c, 18d are integrated on the substrate through the electrical wiring. According to an embodiment, the substrate can be a ceramic substrate, a silicon substrate, or a printed circuit board. According to an embodiment, the circular coils 12a, 12b, 12c, 12d can be suspended on the substrate by the radio frequency microelectromechanical system ("RF MEMS") transformer fabrication process.

The conductor 14a includes a first elongated portion 141, which acts as the secondary loop of the transformer power amplifier 1A, while the circular coils 12a, 12b, 12c, 12d can act as the primary loop of the transformer power amplifier 1A. In an embodiment, each of the circular coils 12a, 12b, 12c, 12d are identical, and are located on both sides of the first elongated portion 141, but may not be limited to only this configuration. If there is only one circular coil (for example 12a) implemented, the circular coil 12a can act as the primary loop of the transformer power amplifier 1A. The first circular coil 12a includes a conducting wire body that has a first input terminal 16a and a second input terminal 18a, in which the first input terminal 16a and the second input terminal 18a are spaced apart and opposite each other to form an opening 125 of the circular coil, that is, a distance t between the first input terminal 16a and the second input terminal 18a is equal to a width t of the opening 125. The circular coils 12a, 12b, 12c, 12d are not limited to the single turn coil structure as shown in FIG. 1A, can include multiple turns such as N, in which N is an integer.

The shape of the circular coils 12a, 12b, 12c, 12d can be a circle, a square, or a polygon with opening. In an embodiment, the first elongated portion 141 can be extended along a straight line, that is, the shape of the first elongated portions 141 may be rectangular; in another embodiment, the first elongated portion 141 can be extended along a curve, that is, the first elongated portions 141 may be in an arc or wave shape.

As shown in FIG. 1A, the shape of the circular coils 12a, 12b, 12c, 12d may be a square loop or a rectangular loop with opening 125, and the shape of the first elongated portion 141 is rectangular. According to an embodiment, a width of the first elongated portions 141 is in the range of approximately 50~70 μm, a width of the first circular coil 12a is in the range of approximately 15~25 μm, a length of the first circular coil 12a is in the range of approximately 100~150 μm, a width of the opening 125 is in the range of approximately 30~50 μm, a distance $g_1$ between the first circular coil 12a and the first elongated portions 141 is in the range of approximately 1~50 μm, and a distance $g_2$ between each other of the circular coils 12a, 12b, 12c and 12d is in the range of approximately 10~20 μm. Of course, the numbers are not limited to the ones mentioned above, and the parameters such as line widths W, w, length L and distance $g_1$ can be adjusted according to the desired Q factor number for the actual implementation.

During the actual implementation, the transformer power amplifier 1A receives signals from a balanced-unbalanced converter, which converts an input signal to a pair of differential signals, and then outputs the signals to the multiple amplifiers 16a, 16b, 16c, 16d, 18a, 18b, 18c, 18d according to the signs of the differential signals, wherein the multiple amplifiers are divided into several pairs of 16a, 18a; 16b, 18b; 16c, 18c; and 16d, 18d, respectively. More specifically, one end of the first amplifier 16a is electrically connected with the first input terminal 121 of the first circular coil 12a, while the other end of the first amplifier 16a receives the first signal; one end of the second amplifier 18a is electrically connected with the second input terminal 123 of the first circular coil 12a, while the other end of the second amplifier 18a receives a second signal, wherein the first and second signals are differential signal pairs from a balanced-unbalanced converter. For example, in an embodiment, the first amplifier 16a receives the positive input while the second amplifier 18a receives the negative input to form a counterclockwise alternating current on the first circular coil 12a. The alternating current could be electromagnetically coupled to the conductor 14a, such that an induced current $I_1$ or an induced voltage is generated on the conductor 14a by electromagnetic inductance. The two sides of the conductor 14a have two nodes that act as two outputs, one as a positive output node and the other one as a negative output node, or one as an output node and the other one as a ground end as shown in FIG. 1A, and the output signal $V_{out}$ is a transformer signal. It is to be understood, however, that the polarity of the amplifiers 16a, 18a can be exchanged to obtain the opposite direction of the induced current.

Similar configurations can be used for the second circular coil 12b, the third circular coil 12c, and the fourth circular coil 12d. For example, in an embodiment, if the direction of the current on the first circular coil 12a is counterclockwise, the direction of the current on the second circular coil 12b may be clockwise, the direction of the current on the third circular coil 12c may be counterclockwise, and the direction of the current on the fourth circular coil 12d may be clockwise, and the magnitudes of the four alternating currents are equal, resulting in better coupling when using multiple circular coils 12a, 12b, 12c, 12d compared with just a single circular coil 12a, and the power of the multiple circular coils 12a, 12b, 12c, 12d induced on the conductor can be synthetized.

In an embodiment, the opening 125 of the first circular coil 12a and the opening of the second circular coil 12b are not facing to the conductor 14a, such that the first circular coil 12a could be connected with the second circular coil 12b, and the connection portion of the first circular coil 12a and the second circular coil 12b could cross over the first elongated portion 141 of the conductor 14a through above or below.

According to an embodiment, the transformer power amplifier 1A further comprises multiple conducting wires (not shown), wherein each wire can receive a direct current source that may be provided to the multiple circular coils 12a, 12b, 12c, 12d. According to another embodiment, the conducting wire may be connected to either the first amplifier 16a or second amplifier 18a of the first circular coil 12a, and similar configurations can be used in the second circular coil 12b, the third circular coil 12c, and the fourth circular coil 12d.

Figure 1B:
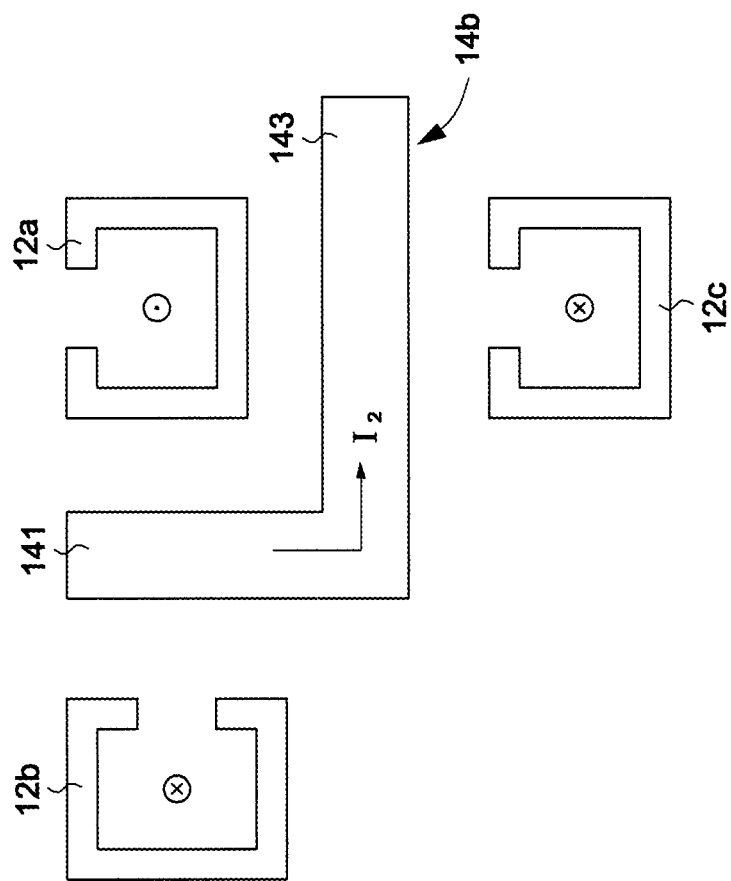
FIG. 1B depicts a transformer power amplifier according to an embodiment of the present disclosure.

FIG. 1B depicts a transformer power amplifier 1B according to an embodiment of the present disclosure. The transformer power amplifier 1B is similar to the transformer power amplifier 1A of FIG. 1A and includes a conductor 14b, multiple circular coils 12a, 12b, 12c, and multiple amplifiers (not shown). The circular coils 12a, 12b, 12c are located near both sides of the conductor 14b. The conductor 14b may further comprise a second elongated portion 143 connected with the first elongated portion 141, the second elongated portion 143 is perpendicular to or has an angle with the first elongated portion 141. That is, the second elongated portion 143 has a predetermined angle with respect to the first elongated portion 141, for example, greater or smaller than 90° as shown in FIG. 1B, in which the conductor 14a is in an L shape.

According to an embodiment, the transformer power amplifier 1B has a single first circular coil 12a located near the first elongated portion 141 and the second elongated portion 143. The first circular coil 12a acts as the primary loop of the transformer power amplifier 1B to induce an induced current $I_2$ or the induced voltage on the conductor 14b. The remaining circular coils 12b and 12c are located on the other side of the conductor 14b and the circular coils 12a, 12b, 12c are symmetrical with respect to the conductor 14b in order to get better coupling. The remaining connections between the amplifier and multiple circular coils 12a, 12b, 12c are the same as shown in FIG. 1A, so they are omitted from FIG. 1B.

Figure 1C:
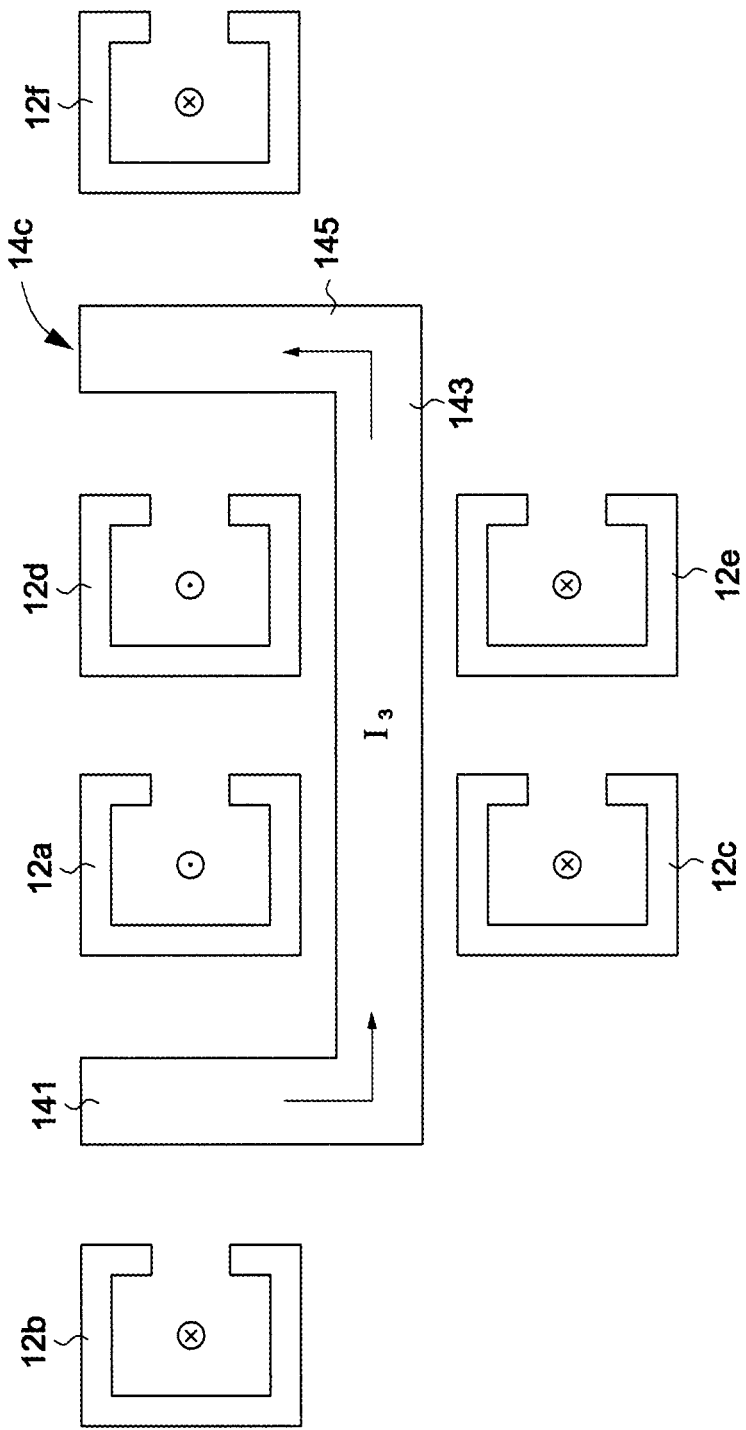
FIG. 1C depicts a transformer power amplifier according to an embodiment of the present disclosure.

FIG. 1C depicts a transformer power amplifier 1C according to an embodiment of the present disclosure. The transformer power amplifier 1C is similar to the transformer power amplifier 1B of FIG. 1B. That is, transformer power amplifier 1B comprises a conductor 14c, multiple circular coils 12a, 12b, 12c, 12d, 12e, 12f, and multiple amplifiers (not shown). The circular coils 12a, 12b, 12c, 12d, 12e, 12f, are located either side of the conductor 14c. In this embodiment, the conductor 14c further comprises a third elongated portion 145, wherein the second elongated portion 143 is connected with the first elongated portion 141 and the third elongated portion 145, and the third elongated portion 145 is facing the first elongated portion 141 to form an U-shape like conductor 14c, as shown in FIG. 1C.

According to an embodiment, the transformer power amplifier 1C has a single first circular coil 12a located between the first elongated portion 141 and the third elongated portion 145 and located near the second elongated portion 143. The first circular coil 12a acts as the primary loop of the transformer power amplifier 1C to induce the induced current $I_3$ or the induced voltage on the conductor 14c. The remaining circular coils 12b, 12c, 12d, 12e, 12f are located on the other side of the conductor 14c and the circular coils 12a, 12b, 12c, 12d, 12e, 12f are symmetrical with respect to the conductor 14c in order to get better coupling.

Similarly, the remaining connection of amplifier and multiple circular coils 12a, 12b, 12c, 12d, 12e, 12f may be the same as shown in FIG. 1A, so they are omitted from FIG. 1C.

Figure 1D:
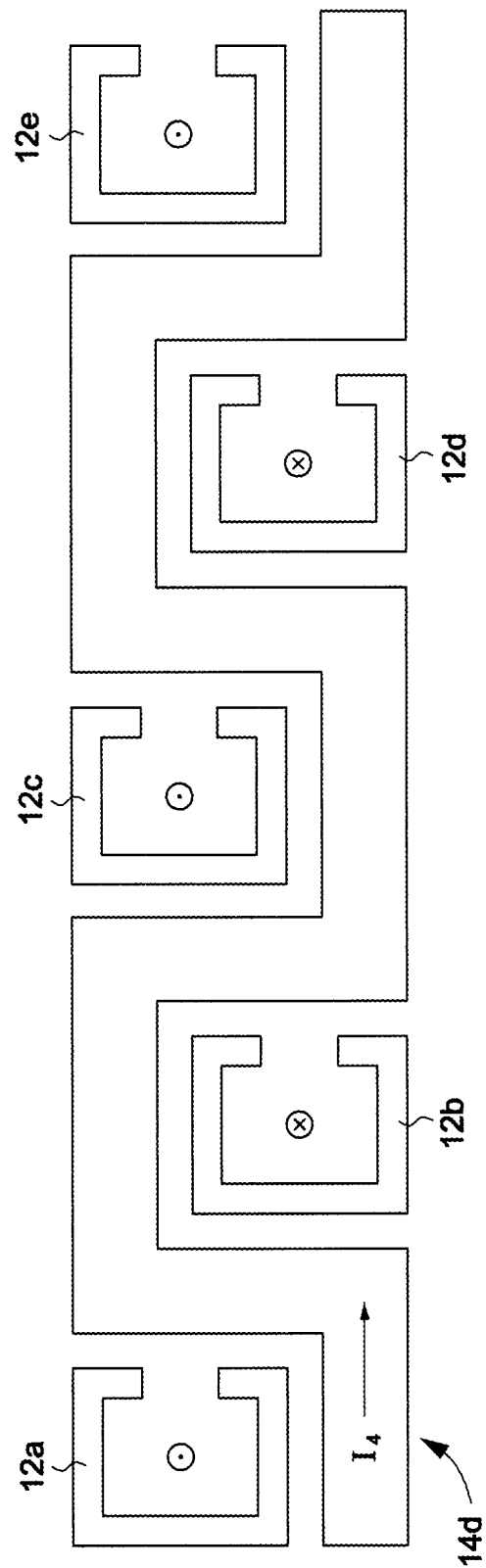
FIG. 1D depicts a transformer power amplifier according to an embodiment of the present disclosure.

FIG. 1D depicts a transformer power amplifier 1D according to an embodiment of the present disclosure. The transformer power amplifier 1D comprises a combination of the transformer power amplifiers depicted in FIGS. 1B and 1C, and the transformer power amplifier 1D includes a sawtooth conductor 14d, multiple circular coils 12a, 12b, 12c, 12d, 12e, and multiple amplifiers (not shown). The circular coils 12a, 12b, 12c, 12d, 12e, are located on either side of the conductor 14d in an alternating pattern, and by connecting the multiple amplifiers to the multiple circular coils 12b, 12c, 12d, 12e to generate the induced current $I_4$ or induced voltage on the conductor 14d.

Figure 2A:
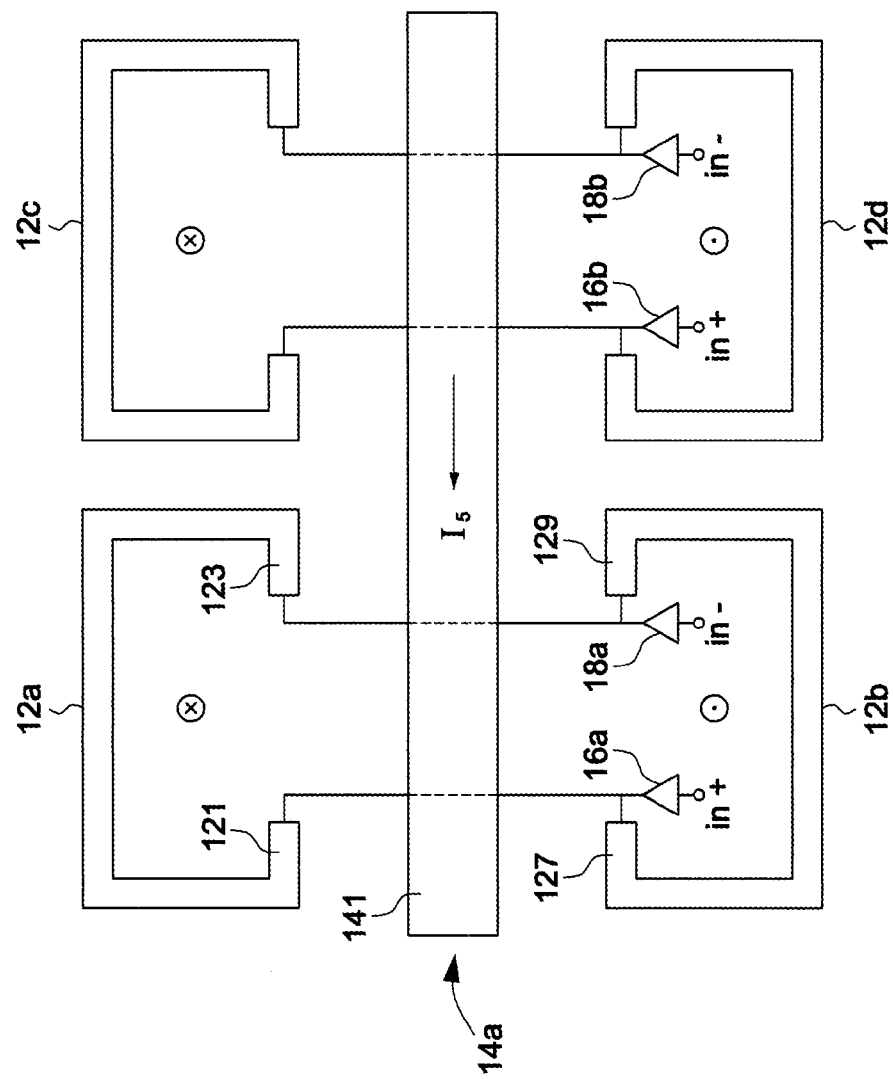
FIG. 2A depicts a transformer power amplifier according to an embodiment of the present disclosure.

FIG. 2A depicts a transformer power amplifier 2A according to an embodiment of the present disclosure. The transformer power amplifier 2A is similar to the transformer power amplifier 1A of FIG. 1A, and comprises a conductor 14a, multiple circular coils 12a, 12b, 12c, 12d, and multiple amplifier pairs 16a, 18a, 16b, 18b, wherein the conductor 14a includes a first elongated portion 141, and the circular coils 12a, 12b, 12c, 12d are located both sides of the conductor 14a. In this embodiment, the difference is that the circular coils 12a, 12b, 12c, 12d are located on the both sides of the conductor 14a are parallelly connected in pairs.

More specifically, the first circular coil 12a and the second circular coil 12b are connected in parallel, the first amplifier 16a is electrically connected to the first input terminal 121 of the first circular coil 12a and the third input terminal 127 of the second circular coil 12b, the second amplifier 18a is electrically connected to the second input internal 123 of the first circular coil 12a and the fourth input internal 129 of the second circular coil 12b to form a first alternating current on the first circular coil 12a and a second alternating current on the second circular coil 12b, wherein the first alternating current and the second alternating current are in opposite directions. More specifically, if the first alternating current on the first circular coils 12a generates a first magnetic field in a direction out of the paper, then the second alternating current on the second circular coils 12b will generate a second magnetic field in a direction out of the paper. Both the first magnetic field and the second magnetic field generate an induced current $I_5$ or the induced voltage on the conductor 14a through the electromagnetic induction effect. Similarly, the third circular coil 12c and the fourth circular coil 12d are connected in parallel, and the connection of the amplifiers 16b, 18b and the circular coils 12c, 12d are the same as the connection of the amplifiers 16a, 18a and the circular coils 12a, 12b.

Figure 2B:
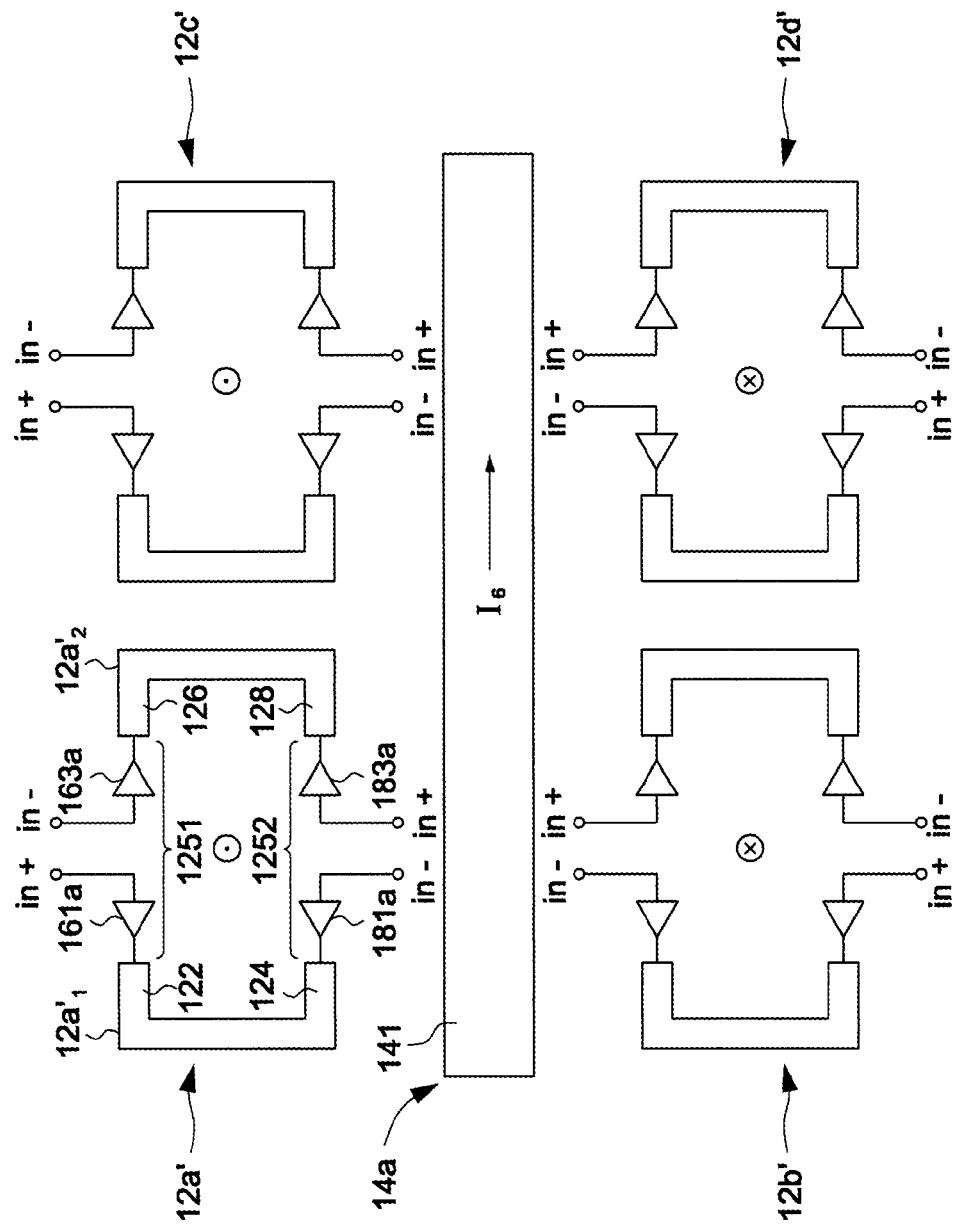
FIG. 2B depicts a transformer power amplifier according to an embodiment of the present disclosure.

FIG. 2B depicts a transformer power amplifier 2B according to an embodiment of the present disclosure. The transformer power amplifier 2B is similar to the transformer power amplifier 1A of FIG. 1A, and comprises a conductor 14a, multiple circular coils 12a', 12b', 12c' 12d', and multiple amplifiers 161a, 181a, 163a 183a, wherein the conductor 14a includes a first elongated portion 141, and the circular coils 12a', 12b', 12c' 12d' are located on either side of the conductor 14a. In this embodiment, the circular coils 12a', 12b', 12c' 12d' are winding by multiple turns of conducting wires, that is, each circular coil has more than one opening. In addition, the number of the amplifiers 161a, 181a, 163a 183a, as well as the connections between each elements, is different from previous embodiments.

More specifically, the first circular coil 12a includes a first conductor wire body $12a'_1$ and a second conductor wire body $12a'_2$, the first conductor wire body $12a'_1$ has a first input terminal 122 and a second input terminal 124, and the second conductor wire body $12a'_2$ has a third input terminal 126 and a fourth input terminal 128, wherein the first input terminal 122 and the third input terminal 126 are spaced apart and opposite each other to form an opening 1251. The second input terminal 124 and the fourth input terminal 128 are spaced apart and opposite with each other to form an opening 1252. Therefore, the first conductor wire body $12a'_1$ and the second conductor wire body $12a'_2$ form a first circular coil 12a' with two openings 1251, 1252.

The first amplifier 161a is electrically connected to the first input 122 of the first conductor wire body $12a'_1$, the second amplifier 181a is electrically connected to the second input 124 of the first conductor wire body $12a'_1$, the third amplifier 163a is electrically connected to the third input 126 of the second conductor wire body $12a'_2$, and the fourth amplifier 183a is electrically connected to the fourth input 128 of the second conductor wire body $12a'_2$. Accordingly, a counter-clockwise alternative current is generated on the first circular coil 12a', then the alternative current generates an induced current $I_6$ or the induced voltage on the conductor 14a through electromagnetic induction effect. Similar configurations can be used in the circular coils 12b', 12c' and 12d'.

FIG. 2C depicts a transformer power amplifier 2C according to an embodiment of the present disclosure. The transformer power amplifier 2C is similar to the transformer power amplifier 1A of FIG. 1A, and comprises a conductor 14a, multiple circular coils $12c_1$, $12c_2$, and multiple amplifiers 17, 19, wherein the conductor 14a includes at least one first elongated portion 141, and the circular coils $12c_1$, $12c_2$ are located on both sides of the conductor 14a.

In this embodiment, the circular coils $12c_1$, $12c_2$ both are actually an 8-shape conductor wiring body 12c'' with an opening 1253; more specifically, the cross portion c of the 8-shape conductor wiring body 12c'' crosses over the first elongated portion 141 of the conductor 14a through, above, or below, therefore, forming the first and the second circular coils $12c_1$, $12c_2$ on either side of the conductor 14a respectively. The opening 1253 can located inside either the first circular coil $12c_1$ or the second circular coil $12c_2$. The 8-shape conductor wiring body 12c'' may have a first input terminal 127' and a second input terminal 129', wherein the first input terminal 127' and the second input terminal 129' are spaced apart and opposite each other to form the opening 1253.

A first amplifier 17 is electrically connected to the first input terminal 127', and a second amplifier 19 is electrically connected to the second input terminal 129', to form alternating currents with opposite direction on the first circular coil $12c_1$ and the second circular coil $12c_2$, and then generate an induced current $I_7$ or an induced voltage on the conductor 14a through the electromagnetic induction effect.

Figure 3A:
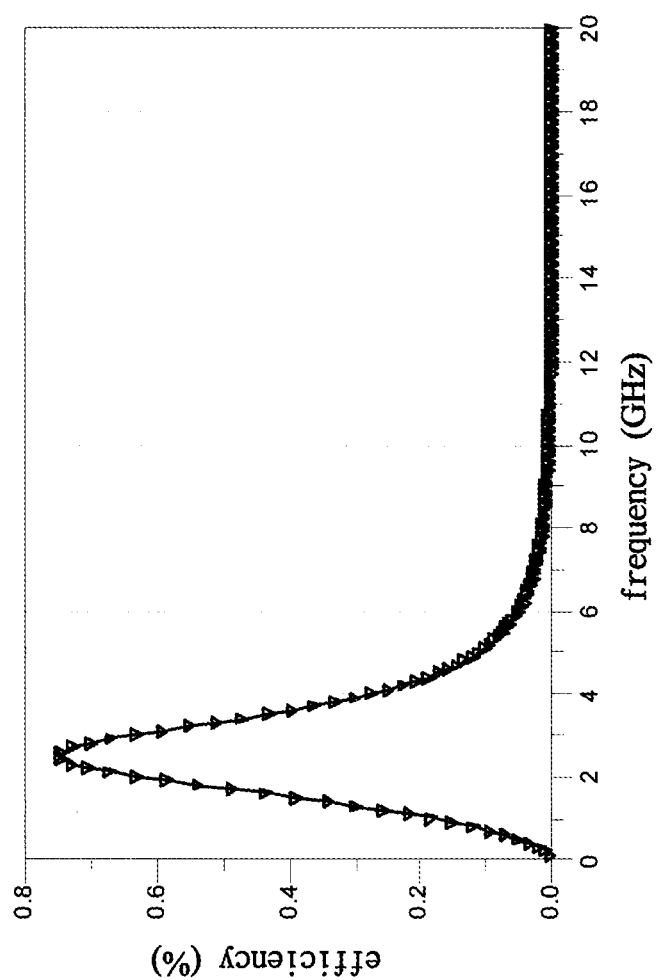
FIG. 3A depicts a graph comparing efficiency versus frequency of the transformer power amplifier according to an embodiment of the present disclosure.
Figure 3B:
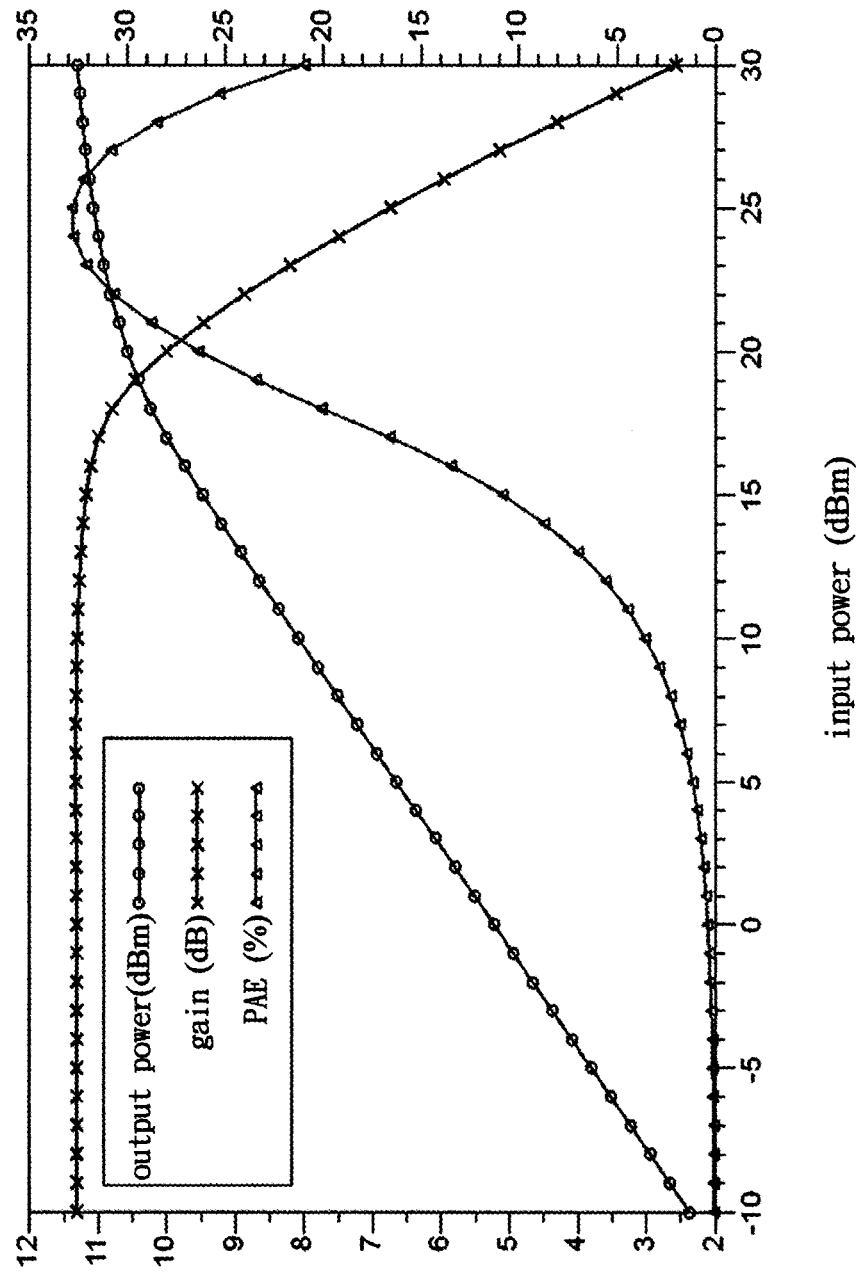
FIG. 3B depicts a graph comparing output power efficiency, gain and power adder efficiency versus input power of the transformer power amplifier according to an embodiment of the present disclosure.

Referring now to FIGS. 3A and 3B, FIG. 3A depicts a graph of efficiency versus frequency of the transformer power amplifier according to an embodiment of the present disclosure, while FIG. 3B depicts a graph of output power efficiency, gain, and power adder efficiency versus input power of the transformer power amplifier, according to an embodiment of the present disclosure.

As shown in FIG. 3A, the transformer power amplifier according to an embodiment of the present disclosure has over 75% efficiency when operated at approximately 2.4 GHz. As shown in FIG. 3B, the maximum output power of the transformer power amplifier according to an embodiment of the present disclosure can be as high as approximately 2 Watts, and its maximum power adder efficiency ("PAE") is near approximately 33%.

As a result, the transformer power amplifier of the present disclosure can improve the Q value and increase its efficiency by reducing the capacitance coupling effect between the metal layers and/or the sidewalls of the same layer through carefully designed conductor structures in its primary and secondary loops.

Realizations in accordance with the present disclosure have been described in the context of particular embodiments. These embodiments are meant to be illustrative and not limiting. Many variations, modifications, additions, and improvements are possible. Accordingly, plural instances may be provided for components described herein as a single instance. Structures and functionality presented as discrete components in the exemplary configurations may be implemented as a combined structure or component. These and other variations, modifications, additions, and improvements may fall within the scope of the invention as defined in the claims that follow.

As may be used herein, the terms "substantial," "substantially," "approximate," and "approximately" provide an industry-accepted tolerance for its corresponding term and/or relativity between items. Such an industry-accepted tolerance ranges from less than one percent to ten percent and corresponds to, but is not limited to, component values, angles, et cetera. Such relativity between items ranges between less than one percent to ten percent.

While various embodiments in accordance with the principles disclosed herein have been described above, it should be understood that they have been presented by way of example only, and not limitation. Thus, the breadth and scope of this disclosure should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the embodiment(s) set out in any claims that may issue from this disclosure. Specifically and by way of example, although the headings refer to a "Technical Field," the claims should not be limited by the language chosen under this heading to describe the so-called field. Further, a description of a technology in the "Background" is not to be construed as an admission that certain technology is prior art to any embodiment(s) in this disclosure. Neither is the "Summary" to be considered as a characterization of the embodiment(s) set forth in issued claims. Furthermore, any reference in this disclosure to "invention" in the singular should not be used to argue that there is only a single point of novelty in this disclosure. Multiple embodiments may be set forth according to the limitations of the multiple claims issuing from this disclosure, and such claims accordingly define the embodiment(s), and their equivalents, that are protected thereby. In all instances, the scope of such claims shall be considered on their own merits in light of this disclosure, but should not be constrained by the headings set forth herein.

What is claimed is:

1. A transformer power amplifier, comprising:
   a substrate;
   a conductor, disposed on the substrate, and having a first elongated portion;
   a first conductor wiring body and a second conductor wiring body located near one side of the first elongated portion, the first conductor wiring body having a first input terminal and a second input terminal, the second conductor wiring body having a third input terminal and a fourth input terminal, wherein the first input terminal and the third input terminal are spaced apart and opposite each other, the second input terminal and the fourth input terminal are spaced apart and opposite each other, the first conductor wiring body and the second conductor wiring body forming a circular coil with two openings;
   a first amplifier and a second amplifier electrically connected to the first input terminal and the second input terminal respectively, the first amplifier receiving a first signal and the second amplifier receiving a second signal, wherein the first signal and the second signal are a pair of differential signals; and
   a third amplifier and a fourth amplifier electrically connected to the third input terminal and the fourth input terminal respectively, the third amplifier receiving the second signal and the fourth amplifier receiving the first signal to form an alternating current on the circular coil and electromagnetically coupled to the conductor.

2. The transformer power amplifier according to claim 1, wherein the shape of the circular coil is a circle loop, a square loop, a rectangular loop, or a polygon loop with an opening.

3. The transformer power amplifier according to claim 1, wherein the first elongated portion is extended along a straight line or a curve.

4. The transformer power amplifier according to claim 1, wherein the conductor further comprises a second elongated portion connected with the first elongated portion, the second elongated portion is perpendicular to or has an angle with the first elongated portion, and the circular coil is located near the first elongated portion and the second elongated portion.

5. The transformer power amplifier according to claim 1, wherein the conductor further comprises a second elongated portion and a third elongated portion, the second elongated portion connected between the first elongated portion and the third elongated portion, and the circular coil is located between the first elongated portion and the third elongated portion, and near the second elongated portion.

6. A transformer power amplifier, comprising:
   a substrate;
   a conductor, disposed on the substrate, and having a first elongated portion, wherein the first elongated portion has a first side and a second side, and the first side and the second side are opposite sides;
   at least one first circular coil, disposed on the substrate, and located near the first side of the first elongated portion, each of the at least one first circular coil having a first input terminal and a second input terminal, wherein the first input terminal and the second input terminal are spaced apart and opposite each other to form an opening;
   at least one second circular coil, disposed on the substrate, and located near the second side of the first elongated portion, each of the at least one second circular coil having a third input terminal and a fourth input terminal, wherein the third input terminal and the fourth input terminal are spaced apart and opposite each other to form an opening;
   a first amplifier and a second amplifier, the first amplifier electrically connected to the first input terminal and the third input terminal, and the second amplifier connected to the second input terminal and the fourth input terminal, to form a first alternative current on the at least one first circuit coil and a second alternative current on the at least one second circuit coil, wherein the first alternative current and the second alternative current are in opposite direction, and electromagnetically coupled to the conductor.

7. The transformer power amplifier according to claim 6, wherein the shape of each of the at least one first circular coil and the at least one second circular coil is a circle loop, a square loop, a rectangular loop, or a polygon loop with an opening.

8. The transformer power amplifier according to claim 6, wherein the first elongated portion is extended along a straight line or a curve.

9. The transformer power amplifier according to claim 6, wherein the conductor further comprises a second elongated portion connected with the first elongated portion, wherein the second elongated portion is perpendicular to or has an angle with the first elongated portion, and the conductor further comprises a second elongated portion and a third elongated portion, the second elongated portion connected between the first elongated portion and the third elongated portion.

10. A transformer power amplifier, comprising: a substrate;
a conductor, disposed on the substrate, and having a first elongated portion, wherein the first elongated portion has a first side and a second side, and the first side and the second side are opposite sides;
at least one first circular coil, disposed on the substrate, and located near the first side of the first elongated portion, each of the at least one first circular coil having a first input terminal and a second input terminal, wherein the first input terminal and the second input terminal are spaced apart and opposite each other to form an opening;
at least one second circular coil, disposed on the substrate, and located near the second side of the first elongated portion, each of the at least one second circular coil having a third input terminal and a fourth input terminal, wherein the third input terminal and the fourth input terminal are spaced apart and opposite each other to form an opening;
a first amplifier, a second amplifier, a third amplifier, and a fourth amplifier, the first amplifier connected to the first input terminal, the second amplifier connected to the second input terminal to form a first alternative current on each of the at least one first circuit coil, the third amplifier connected to the third input terminal, and the fourth amplifier connected to the fourth input terminal to form a second alternative current on each of the at least one second circuit coil, wherein the first alternative current and the second alternative current are in opposite directions, and respectively electromagnetically coupled to the conductor.

11. The transformer power amplifier according to claim 10, wherein the shape of each of the first circular coil and the second circular coil circular coil is a circle loop, a square loop, a rectangular loop, or a polygon loop with an opening.

12. The transformer power amplifier according to claim 10, wherein the first elongated portion is extended along a straight line or a curve.

13. The transformer power amplifier according to claim 10, wherein the conductor further comprises a second elongated portion connected with the first elongated portion, the second elongated portion is perpendicular to or has an angle with the first elongated portion.

14. The transformer power amplifier according to claim 10, wherein the conductor further comprises a second elongated portion and a third elongated portion, and the second elongated portion is connected between the first elongated portion and the third elongated portion.

15. The transformer power amplifier according to claim 10, wherein the first circular coil is connected with the second circular coil, and the connection portion of the first circular coil and the second circular coil is under or above the conductor.

16. A transformer power amplifier, comprising: a substrate;
a conductor, disposed on the substrate, and having a first elongated portion;
an 8-shape conductor wiring body, comprising a first circular coil, a second circular coil, a cross portion, a first input terminal, and a second input terminal, wherein the cross portion is connected to the first circular coil and the second circular coil and located across the first elongated portion, the first circular coil and the second circular coil are located near two opposite sides of the first elongated portion respectively, the first input terminal and the second input terminal are spaced apart and opposite each other to form an opening;
a first amplifier electrically connected to the first input terminal for receiving a first signal; and
a second amplifier electrically connected to the second input terminal for receiving a second signal, wherein the first signal and the second signal are differential signals to form an alternative current on the 8-shape conductor wiring body and electromagnetically coupled to the conductor.

17. The transformer power amplifier according to claim 16, wherein the shape of the first circular coil and the second circular coil is a circle loop, a square loop, a rectangular loop, or a polygon loop with an opening.

18. The transformer power amplifier according to claim 16, wherein the first elongated portion is extended along a straight line or a curve.

19. The transformer power amplifier according to claim 16, wherein the conductor further comprises a second elongated portion connected with the first elongated portion, the second elongated portion is perpendicular to or has an angle with the first elongated portion.

20. The transformer power amplifier according to claim 16, wherein the conductor further comprises a second elongated portion and a third elongated portion, and the second elongated portion connected between the first elongated portion and the third elongated portion.

* * * * *